United States Patent
Sugihara

(10) Patent No.: US 11,569,057 B2
(45) Date of Patent: Jan. 31, 2023

(54) PATTERN INSPECTION APPARATUS AND PATTERN OUTLINE POSITION ACQUISITION METHOD

(71) Applicant: NuFlare Technology, Inc., Yokohama (JP)

(72) Inventor: Shinji Sugihara, Ota-ku (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 17/320,435

(22) Filed: May 14, 2021

(65) Prior Publication Data

US 2022/0013327 A1 Jan. 13, 2022

(30) Foreign Application Priority Data

Jul. 13, 2020 (JP) .............................. JP2020-119714

(51) Int. Cl.
*H01J 37/22* (2006.01)
*H01J 37/244* (2006.01)
(Continued)

(52) U.S. Cl.
CPC ............ *H01J 37/222* (2013.01); *G06T 7/001* (2013.01); *G06T 7/73* (2017.01); *H01J 37/09* (2013.01);
(Continued)

(58) Field of Classification Search
CPC .......... H01J 37/222; H01J 37/09; H01J 37/10; H01J 37/28; H01J 2237/0453;
(Continued)

(56) References Cited

U.S. PATENT DOCUMENTS

2002/0148961 A1* 10/2002 Nakasuji ............ G01N 23/2251
250/311
2009/0001267 A1* 1/2009 Enyama ................. G01N 23/22
250/310

(Continued)

FOREIGN PATENT DOCUMENTS

| JP | 2011-007728 A | 1/2011 |
| JP | 2011-048592 A | 3/2011 |
| JP | 2021-77229 A | 5/2021 |

OTHER PUBLICATIONS

Canny, "A Computational Approach to Edge Detection", IEEE Transactions on Pattern Analysis and Machine Intelligence, vol. PAMI-8, No. 6, Nov. 1986, pp. 679-698.

*Primary Examiner* — David A Vanore
(74) *Attorney, Agent, or Firm* — Oblon, McClelland, Maier & Neustadt, L.L.P.

(57) ABSTRACT

According to one aspect of the present invention, a pattern inspection apparatus includes a circuit configured to perform, for each direction, filter processing on the image, using a plurality of two-dimensional spatial filter functions with different orientations; a circuit configured to extract a plurality of pixels each having a predetermined value larger than a first threshold, in pixel values each for the each direction of after the filter processing, as a plurality of outline pixel candidates through which an outline of the figure pattern passes; and a circuit configured to extract a plurality of outline pixels from the plurality of outline pixel candidates by excluding outline pixel candidates each of which has a differential value, greater than or equal to a second threshold, obtained by differentiating a pixel value of before the filter processing in a second direction orthogonal to a first direction corresponding to the predetermined value.

14 Claims, 20 Drawing Sheets

(51) Int. Cl.
*H01J 37/10* (2006.01)
*H01J 37/09* (2006.01)
*G06T 7/00* (2017.01)
*G06T 7/73* (2017.01)
*H01J 37/28* (2006.01)

(52) U.S. Cl.
CPC ............ H01J 37/10 (2013.01); H01J 37/244 (2013.01); *G06T 2207/10061* (2013.01); *G06T 2207/30148* (2013.01); *H01J 37/28* (2013.01); *H01J 2237/0453* (2013.01); *H01J 2237/221* (2013.01); *H01J 2237/2448* (2013.01); *H01J 2237/2817* (2013.01)

(58) Field of Classification Search
CPC ......... H01J 2237/221; H01J 2237/2448; H01J 2237/2817; H01J 2237/2446; H01J 2237/24592; G06T 7/73; G06T 2207/10061; G06T 2207/30148; G06T 7/13; G06T 7/01; G01B 11/24; G01B 11/03; G01N 21/9501; G01N 21/956; G03F 1/84
See application file for complete search history.

(56) References Cited

U.S. PATENT DOCUMENTS

| | | | |
|---|---|---|---|
| 2019/0026596 A1* | 1/2019 | Shiratsuchi | G06T 7/12 |
| 2020/0211811 A1* | 7/2020 | Ren | H01J 37/28 |
| 2020/0286709 A1* | 9/2020 | Shiratsuchi | H01J 37/22 |
| 2021/0010959 A1* | 1/2021 | Shiratsuchi | H01J 37/3005 |
| 2021/0142457 A1 | 5/2021 | Sugihara | |
| 2021/0319974 A1* | 10/2021 | Inoue | H01J 37/1477 |

* cited by examiner $f_{2i}$ f25

| 0 | 0 | −1 | 0 | 0 |
|---|---|---|---|---|
| 0 | 0 | −1 | 0 | 0 |
| 0 | 0 | 4 | 0 | 0 |
| 0 | 0 | −1 | 0 | 0 |
| 0 | 0 | −1 | 0 | 0 | f26

| 0 | −0.6488 | −0.1989 | 0 | 0 |
|---|---|---|---|---|
| 0 | −0.4701 | −0.6060 | 0 | 0 |
| 0 | −0.0291 | 3.9060 | −0.0291 | 0 |
| 0 | 0 | −0.6060 | −0.4701 | 0 |
| 0 | 0 | −0.1989 | −0.6488 | 0 | f27

| −0.1716 | −0.2426 | 0 | 0 | 0 |
|---|---|---|---|---|
| −0.2426 | −0.8431 | −0.2071 | 0 | 0 |
| 0 | −0.2071 | 3.8284 | −0.2071 | 0 |
| 0 | 0 | −0.2071 | −0.8431 | −0.2426 |
| 0 | 0 | 0 | −0.2426 | −0.1716 | f28

| 0 | 0 | 0 | 0 | 0 |
|---|---|---|---|---|
| −0.6488 | −0.4701 | −0.0291 | 0 | 0 |
| −0.1989 | −0.6060 | 3.9060 | −0.6060 | −0.1989 |
| 0 | 0 | −0.0291 | −0.4701 | −0.6488 |
| 0 | 0 | 0 | 0 | 0 |

FIG.10

PATTERN INSPECTION APPARATUS AND PATTERN OUTLINE POSITION ACQUISITION METHOD

CROSS-REFERENCE TO RELATED APPLICATION

This application is based upon and claims the benefit of priority from prior Japanese Patent Application No. 2020-119714 filed on Jul. 13, 2020 in Japan, the entire contents of which are incorporated herein by reference.

BACKGROUND OF THE INVENTION

Field of the Invention

Embodiments of the present invention relate to a pattern inspection apparatus and a pattern outline position acquisition method. For example, embodiments of the present invention relate to an inspection apparatus that performs inspection using a secondary electron image of a pattern emitted from the substrate irradiated with multiple electron beams, an inspection apparatus that performs inspection using an optical image of a pattern acquired from the substrate irradiated with ultraviolet rays, and a method for acquiring the outline position of a pattern in an image to be used for the inspection.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as the scale of patterns which make up LSI has reached the order of 10 nanometers or less, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

As a defect inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there is "die-to-die inspection" or "die-to-database inspection". The "die-to-die inspection" method compares data of measured images acquired by imaging the same patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

Specifically, with respect to the pattern inspection apparatus described above, in addition to the type of apparatus that irradiates an inspection substrate with laser beams in order to obtain a transmission image or a reflection image of a pattern formed on the substrate, another type of inspection apparatus has been developed that acquires a pattern image by scanning the inspection substrate with primary electron beams and detecting secondary electrons emitted from the inspection substrate by the irradiation with the primary electron beams. Regarding such pattern inspection apparatuses, it has been examined, instead of comparing pixel values, to extract (obtain) the outline of a pattern in an image, and use the distance between the obtained outline and the outline of a reference image, as a determining index. Meanwhile, it takes time to acquire an image to be used for inspection, and thus, reduction of the inspection processing time by enlarging the pixel size is requested. However, since resolution is degraded along with increase of the pixel size, there is a problem of difficulty in accurately extracting a pattern outline position from an image. Such a problem is not limited to pattern inspection. A similar problem may also occur in other cases of extracting the outline position of a pattern from an image. Particularly, images obtained using electron beams have much luminance unevenness due to charging-up, etc., and consequently, outlines are incorrectly extracted.

There is disclosed a method in which edge candidates are obtained using a Sobel filter, etc., and then, a second differential value of a concentration value is calculated using the edge candidates and adjacent pixels for each pixel in the inspection region. Further, in two pixel groups adjacent to the edge candidates, one of the pixel groups that has more number of combinations of different signs of second differential values is selected as a pixel group of second edge candidates. Then, using the second differential value of the edge candidate, and that of the second edge candidate, the edge coordinate of the target edge to be detected is obtained for each sub-pixel (e.g., refer to Japanese Patent Application Laid-open (JP-A) No. 2011-48592).

BRIEF SUMMARY OF THE INVENTION

According to one aspect of the present invention, a pattern inspection apparatus includes: an image acquisition mechanism configured to include an emission source to emit beams, a lens to focus the beams, and a detector to detect a beam intensity, and configured to acquire an image of a substrate on which a figure pattern has been formed; a filter processing circuit configured to perform, for each direction, filter processing on the image, using a plurality of two-dimensional spatial filter functions with different orientations; an outline pixel candidate extraction circuit configured to extract a plurality of pixels each having a predetermined value larger than a first threshold, in pixel values each for the each direction of after the filter processing, as a plurality of outline pixel candidates through which an outline of the figure pattern passes; an outline pixel extraction circuit configured to extract a plurality of outline pixels from the plurality of outline pixel candidates by excluding outline pixel candidates each of which has a differential value, greater than or equal to a second threshold, obtained by differentiating a pixel value of before the filter processing in a second direction orthogonal to a first direction corresponding to the predetermined value; an outline position calculation circuit configured to calculate, for each of the plurality of outline pixels, an outline position per sub-pixel, using a one-dimensional profile in the first direction corresponding to the predetermined value; and a comparison circuit configured to compare an outline of the image and a predetermined reference outline, based on data of the outline position.

According to another aspect of the present invention, a pattern outline position acquisition method includes: performing, for each direction, filter processing on an image of a substrate on which a figure pattern has been formed, using a plurality of two-dimensional spatial filter functions with different orientations; extracting a plurality of pixels each having a predetermined value larger than a first threshold, in pixel values each for the each direction of after the filter processing, as a plurality of outline pixel candidates through which an outline of the figure pattern passes; extracting a plurality of outline pixels from the plurality of outline pixel candidates by excluding outline pixel candidates each of which has a differential value, greater than or equal to a second threshold, obtained by differentiating a pixel value of before the filter processing in a second direction orthogonal to a first direction corresponding to the predetermined value; and calculating, for each of the plurality of outline pixels, an outline position per sub-pixel, using a one-dimensional profile in the first direction corresponding to the predetermined value, and outputting the outline position.

BRIEF DESCRIPTION OF THE DRAWINGS

FIG. 10 shows examples of a remaining part of two-dimensional Laplacian filters in all (every) directions in a large scale according to the first embodiment;

DETAILED DESCRIPTION OF THE INVENTION

Embodiments of the present invention describe an apparatus and method that can highly accurately extract an outline position.

The embodiments below describe an electron beam inspection apparatus as an example of a pattern inspection apparatus, but it is not limited thereto. For example, the inspection apparatus may be the one in which the inspection substrate is irradiated with ultraviolet rays to obtain an inspection image using a light transmitted through the inspection substrate or reflected therefrom. Further, the embodiments below describe an inspection apparatus using multiple electron beams to acquire an image, but it is not limited thereto. The inspection apparatus using a single electron beam to acquire an image may also be employed.

First Embodiment

Figure 1:
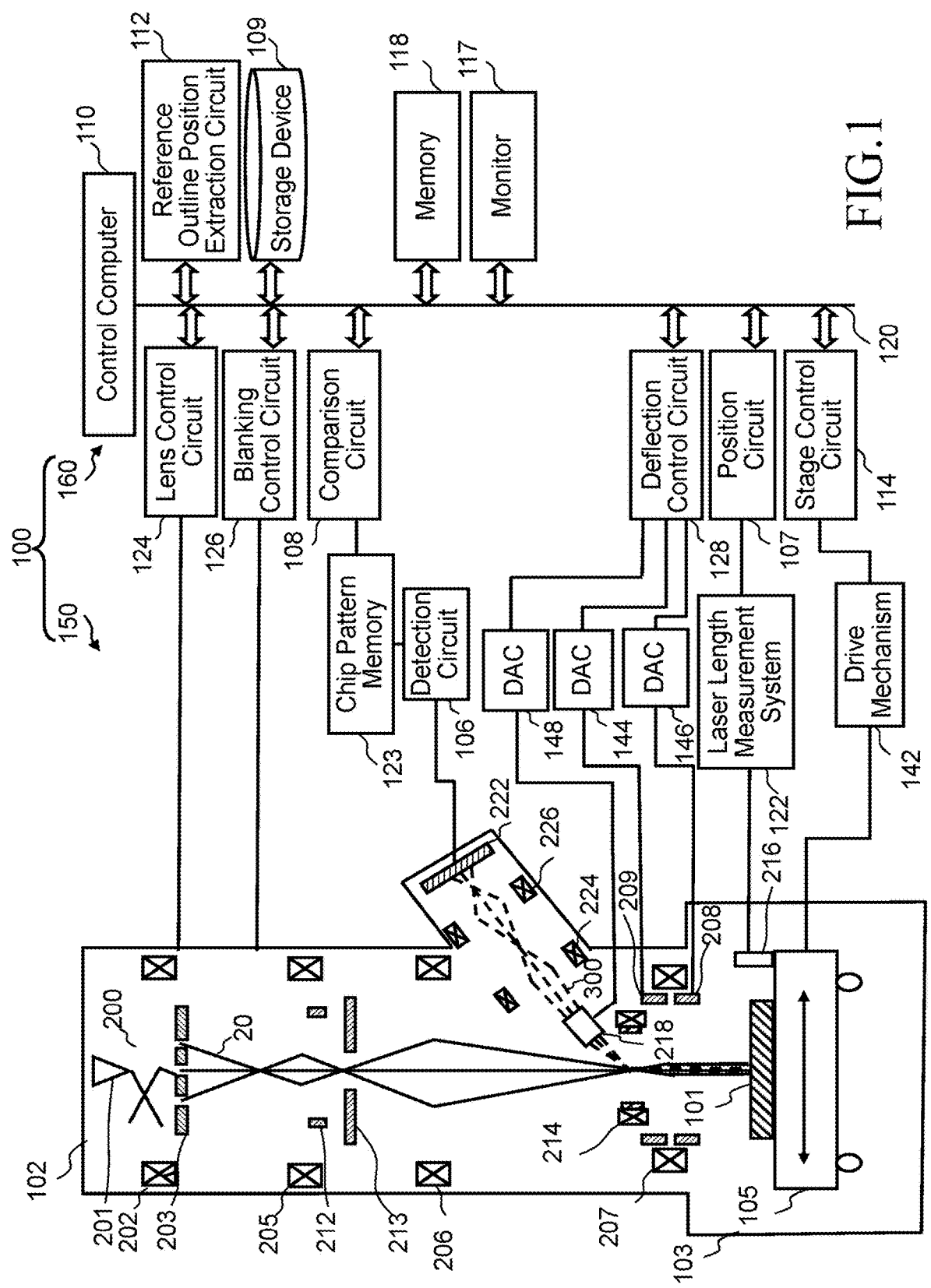
FIG. 1 shows an example of a configuration of a pattern inspection apparatus according to a first embodiment.

FIG. 1 shows an example of a configuration of a pattern inspection apparatus according to a first embodiment. In FIG. 1, an inspection apparatus 100 for inspecting a pattern formed on the substrate is an example of a multi electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a bundle blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222. In the case of FIG. 1, a primary electron optical system which irradiates a substrate 101 with multiple primary electron beams is composed of the electron gun 201, the electromagnetic lens 202, the shaping aperture array substrate 203, the electromagnetic lens 205, the bundle blanking deflector 212, the limiting aperture substrate 213, the electromagnetic lens 206, the electromagnetic lens 207 (objective lens), the main deflector 208, and the sub deflector 209. A secondary electron optical system which irradiates the multi-detector 222 with multiple secondary electron beams is composed of the beam separator 214, the deflector 218, the electromagnetic lens 224, and the electromagnetic lens 226.

In the inspection chamber 103, there is disposed a stage 105 movable at least in the x and y directions. The substrate 101 (target object) to be inspected is mounted on the stage 105. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is mainly described below. The substrate 101 is placed with its pattern-forming surface facing upward on the stage 105, for example. Moreover, on the stage 105, there is disposed a mirror 216 which reflects a laser beam for measuring a laser length emitted from a laser length measuring system 122 arranged outside the inspection chamber 103. The multi-detector 222 is connected, at the outside of the electron beam column 102, to a detection circuit 106.

In the control system circuit 160, a control computer 110 which controls the whole of the inspection apparatus 100 is connected, through a bus 120, to a position circuit 107, a comparison circuit 108, a reference outline position extraction circuit 112, a stage control circuit 114, a lens control circuit 124, a blanking control circuit 126, a deflection control circuit 128, a storage device 109 such as a magnetic disk drive, a monitor 117, and a memory 118. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The detection circuit 106 is connected to a chip pattern memory 123 which is connected to the comparison circuit 108. The stage 105 is driven by a drive mechanism 142 under the control of the stage control circuit 114. In the drive mechanism 142, for example, a drive system such as a three (x-, y-, and θ-) axis motor which provides drive in the directions of x, y, and θ in the stage coordinate system is configured, and the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set, for example, with respect to a plane perpendicular to the optical axis (center axis of electron trajectory) of the multiple primary electron beams.

The electromagnetic lenses 202, 205, 206, 207 (objective lens), 224 and 226, and the beam separator 214 are controlled by the lens control circuit 124. The bundle blanking deflector 212 is configured by two or more electrodes (or poles), and each electrode is controlled by the blanking control circuit 126 through a DAC amplifier (not shown). The sub deflector 209 is configured by four or more electrodes (or poles), and each electrode is controlled by the deflection control circuit 128 through the DAC amplifier 144. The main deflector 208 is configured by four or more electrodes (or poles), and each electrode is controlled by the deflection control circuit 128 through the DAC amplifier 146. The deflector 218 is configured by four or more electrodes (or poles), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
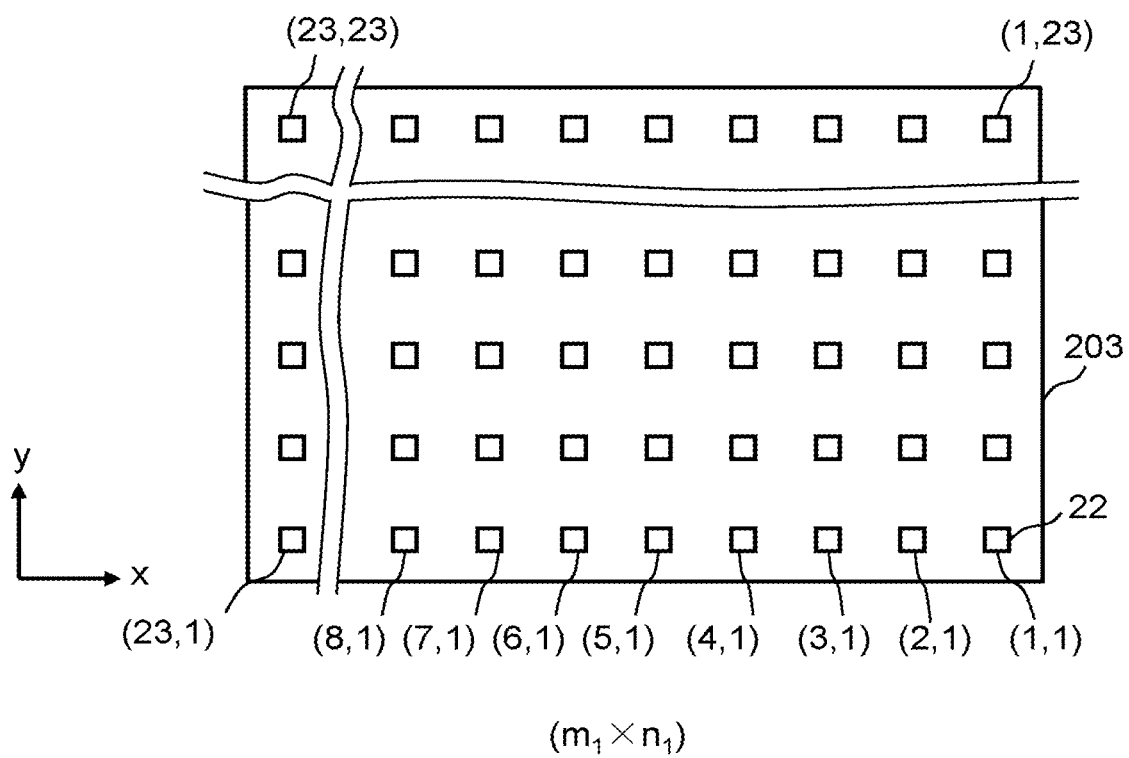
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) (each column in the y direction) and $n_1$ rows long (length in the y direction) (each row in the x direction) are two-dimensionally formed at a predetermined arrangement pitch in the shaping aperture array substrate 203, where one of $m_1$ and $n_1$ is an integer of 2 or more, and the other is an integer of 1 or more. In the case of FIG. 2, 23×23 holes (openings) 22 are formed. Ideally, each of the holes 22 is a rectangle (including a square) having the same dimension, shape, and size. Alternatively, ideally, each of the holes 22 may be a circle with the same outer diameter. $m_1 \times n_1$ (=N) multiple primary electron beams 20 are formed by letting portions of the electron beam 200 individually pass through a corresponding one of a plurality of holes 22.

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200, which irradiate the positions of the plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens) while repeating forming an intermediate image and a crossover through the beam separator 214 disposed at the crossover position of each beam (at the intermediate image position of each beam) of the multiple primary electron beams 20. Then, the electromagnetic lens 207 focuses the multiple primary electron beams 20 onto the substrate 101. The multiple primary electron beams 20 having been focused on the substrate 101 (target object) by the electromagnetic lens 207 (objective lens) are collectively deflected by the main deflector 208 and the sub deflector 209 to irradiate respective beam irradiation positions on the substrate 101. When all of the multiple primary electron beams 20 are collectively deflected by the bundle blanking deflector 212, they deviate from the hole in the center of the limiting aperture substrate 213 and blocked by the limiting aperture substrate 213. On the other hand, the multiple primary electron beams 20 which were not deflected by the bundle blanking deflector 212 pass through the hole in the center of the limiting aperture substrate 213 as shown in FIG. 1. Blanking control is provided by On/Off of the bundle blanking deflector 212, and thus On/Off of the multiple beams is collectively controlled. In this way, the limiting aperture substrate 213 blocks the multiple primary electron beams 20 which were deflected to be in the "Off condition" by the bundle blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation with the multiple primary electron beams 20.

The multiple secondary electron beams 300 emitted from the substrate 101 travel to the beam separator 214 through the electromagnetic lens 207.

Here, it is preferable to use, for example, an E×B separator as the beam separator 214. The beam separator (E×B separator) 214 includes a plurality of, at least two, electrodes (poles) which generate an electric field, and a plurality of, at least two, magnetic poles, each having a coil, which generate a magnetic field. There is at least a pair of opposite electrodes in the plurality of electrodes. There is at least a pair of opposite magnetic poles in the plurality of magnetic poles. The beam separator 214 generates an electric field and a magnetic field to be perpendicular to each other in a plane orthogonal to the traveling direction of the center beam (that is, the electron trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the beams 20 travel straight downward. In contrast, with respect to the multiple secondary electron beams 300 entering the beam separator 214 from the lower side, since both the force due to the electric field and the force due to the magnetic field are exerted in the same direction, the beams 300 are bent obliquely upward, and separated from the multiple primary electron beams 20.

The multiple secondary electron beams 300 having been bent obliquely upward and separated from the multiple primary electron beams 20 are further bent by the deflector 218, and projected, while being refracted, onto the multi-detector 222 by the electromagnetic lenses 224 and 226. The multi-detector 222 detects the projected multiple secondary electron beams 300. It is acceptable that reflected electrons and secondary electrons are projected on the multi-detector 222, or that reflected electrons are emitted along the way and remaining secondary electrons are projected. The multi-detector 222 includes a two-dimensional sensor. Each secondary electron of the multiple secondary electron beams 300 collides with a corresponding region of the two-dimensional sensor, so that electrons are generated and secondary electron image data for each pixel is produced. In other words, in the multi-detector 222, a detection sensor is disposed for each primary electron beam of the multiple primary electron beams 20. Then, the detection sensor detects a corresponding secondary electron beam emitted by irradiation with each primary electron beam. Therefore, each of a plurality of detection sensors in the multi-detector 222 detects an intensity signal of a secondary electron beam for an image resulting from irradiation with an associated corresponding primary electron beam. The intensity signal detected by the multi-detector 222 is output to the detection circuit 106.

Figure 3:
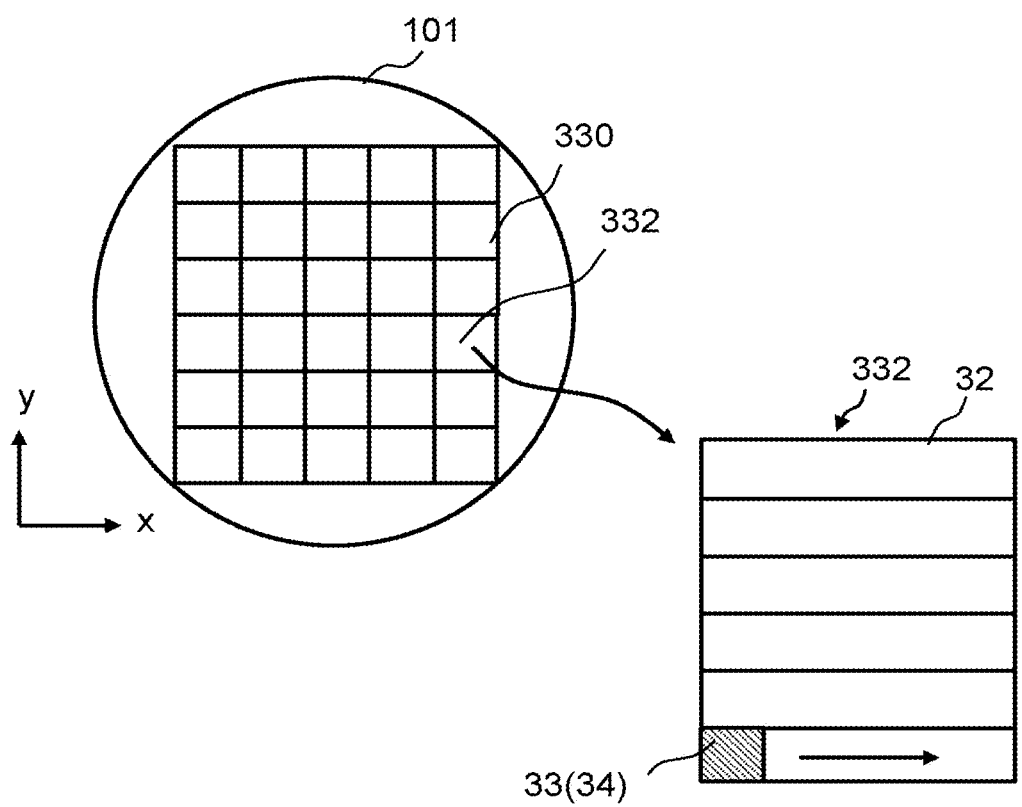
FIG. 3 shows an example of a plurality of chip regions formed on a semiconductor substrate, according to the first embodiment.

FIG. 3 shows an example of a plurality of chip regions formed on a semiconductor substrate, according to the first embodiment. In FIG. 3, in the case of the substrate 101 being a semiconductor substrate (wafer), a plurality of chips (wafer dies) 332 in a two-dimensional array are formed in an inspection region 330 of the semiconductor substrate (wafer). With respect to each chip 332, a mask pattern for one chip formed on an exposure mask substrate is reduced to, for example, ¼, and exposed/transferred onto each chip 332 by an exposure device, such as a stepper and a scanner, (not shown). For example, the region of each chip 332 is divided in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

Figure 4:
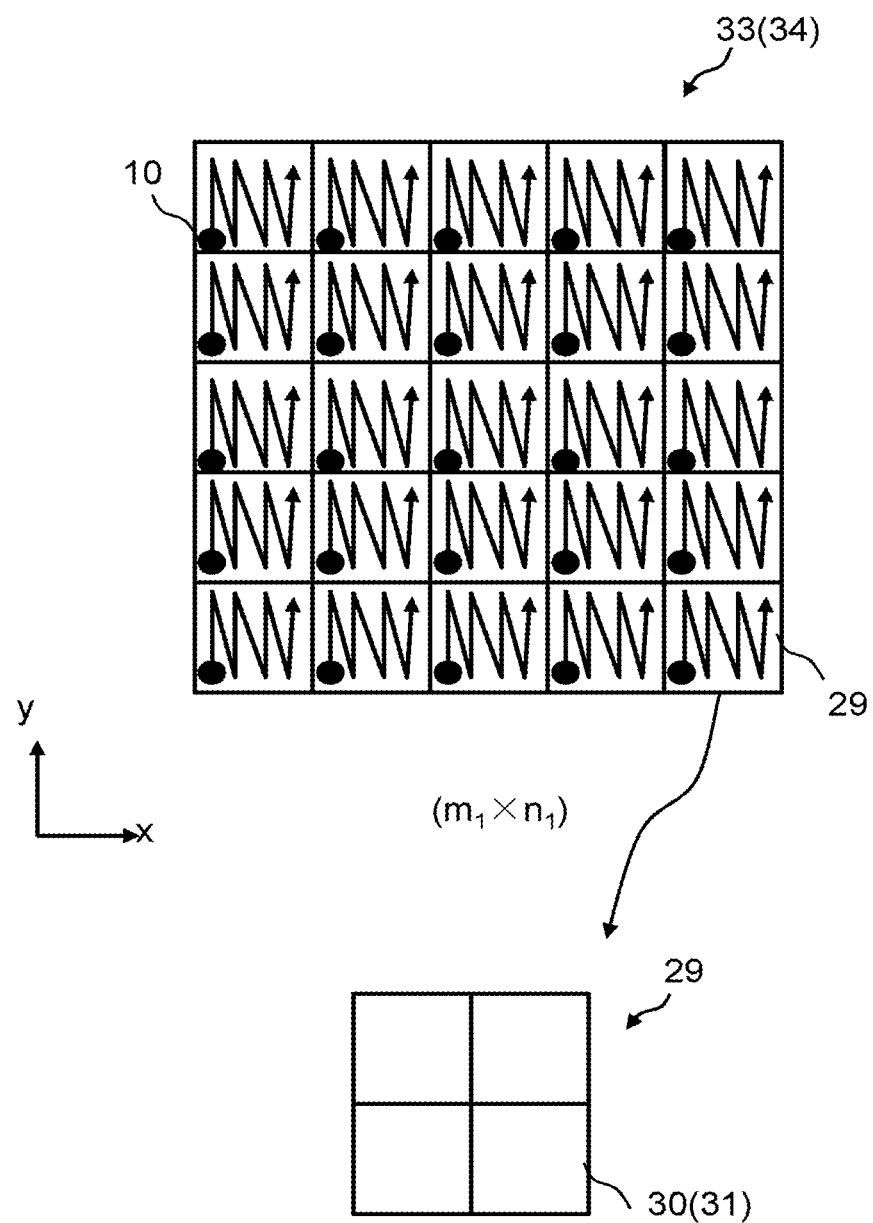
FIG. 4 illustrates a scanning operation with multiple beams according to the first embodiment.

FIG. 4 illustrates a scanning operation with multiple beams according to the first embodiment. FIG. 4 shows the case of multiple primary electron beams 20 of 5 rows×5 columns. The size of an irradiation region 34 which can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the case of FIGS. 3 and 4, the irradiation region 34 and the rectangular region 33 are of the same size. However, it is not limited thereto. The irradiation region 34 may be smaller than the rectangular region 33, or larger than it. Each beam of the multiple primary electron beams 20 irradiates and scans the inside of a sub-irradiation region 29 which is surrounded by the beam pitch in the x direction and the beam pitch in the y direction and in which the beam concerned itself is located. Each primary electron beam 10 of the multiple primary electron beams 20 is associated with any one of the sub-irradiation regions 29 which are different from each other. At the time of each shot, each primary electron beam 10 is applied to the same position in the associated sub-irradiation region 29. The primary electron beam 10 is moved in the sub-irradiation region 29 by collective deflection of all the multiple primary electron beams 20 by the sub deflector 209. By repeating this operation, the inside of one sub-irradiation region 29 is irradiated with one primary electron beam 10 in order. Then, when scanning of one sub-irradiation region 29 is completed, the irradiation position is moved to an adjacent rectangular region 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation position is moved to the next stripe region 32 by moving the stage 105 and/or by collectively deflecting all of the multiple primary electron beams 20 by the main deflector 208. As described above, a secondary electron image of each sub-irradiation region 29 is acquired by irradiation with each primary electron beam 10. By combining secondary electron images of respective sub-irradiation regions 29, a secondary electron image of the rectangular region 33, a secondary electron image of the stripe region 32, or a secondary electron image of the chip 332 is configured.

As shown in FIG. 4, each sub-irradiation region 29 is divided into a plurality of rectangular frame regions 30, and a secondary electron image (inspection image) in units of frame regions 30 is used for inspection. In the example of FIG. 4, one sub-irradiation region 29 is divided into four frame regions 30, for example. However, the number used for the dividing is not limited to four, and another number may be used.

It is also preferable to group, for example, a plurality of chips 332 aligned in the x direction as one group, and to divide in the y direction each group into a plurality of stripe regions 32 by a predetermined width, for example. Then, moving from one stripe region 32 to another may be performed not only per chip 332 but also per group.

When the multiple primary electron beams 20 irradiate the substrate 101 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, when the inside of the sub-irradiation region 29 is scanned, the emission position of each secondary electron beam changes every second in the sub-irradiation region 29. Thus, the deflector 218 collectively deflects the multiple secondary electron beams 300 so that each secondary electron beam whose emission position has changed as described above may be applied to a corresponding detection region of the multi-detector 222.

With respect to pattern defect detection, pattern CD (size) error is one of those that should be detected from a frame image 31 of each frame region 30 which is an inspection image to be inspected. Thus, it is required to accurately detect a pattern outline or a plurality of outline positions on the outline. Then, the first embodiment describes a configuration for accurately extracting the outline position of a figure pattern in the frame image 31.

Figure 5:
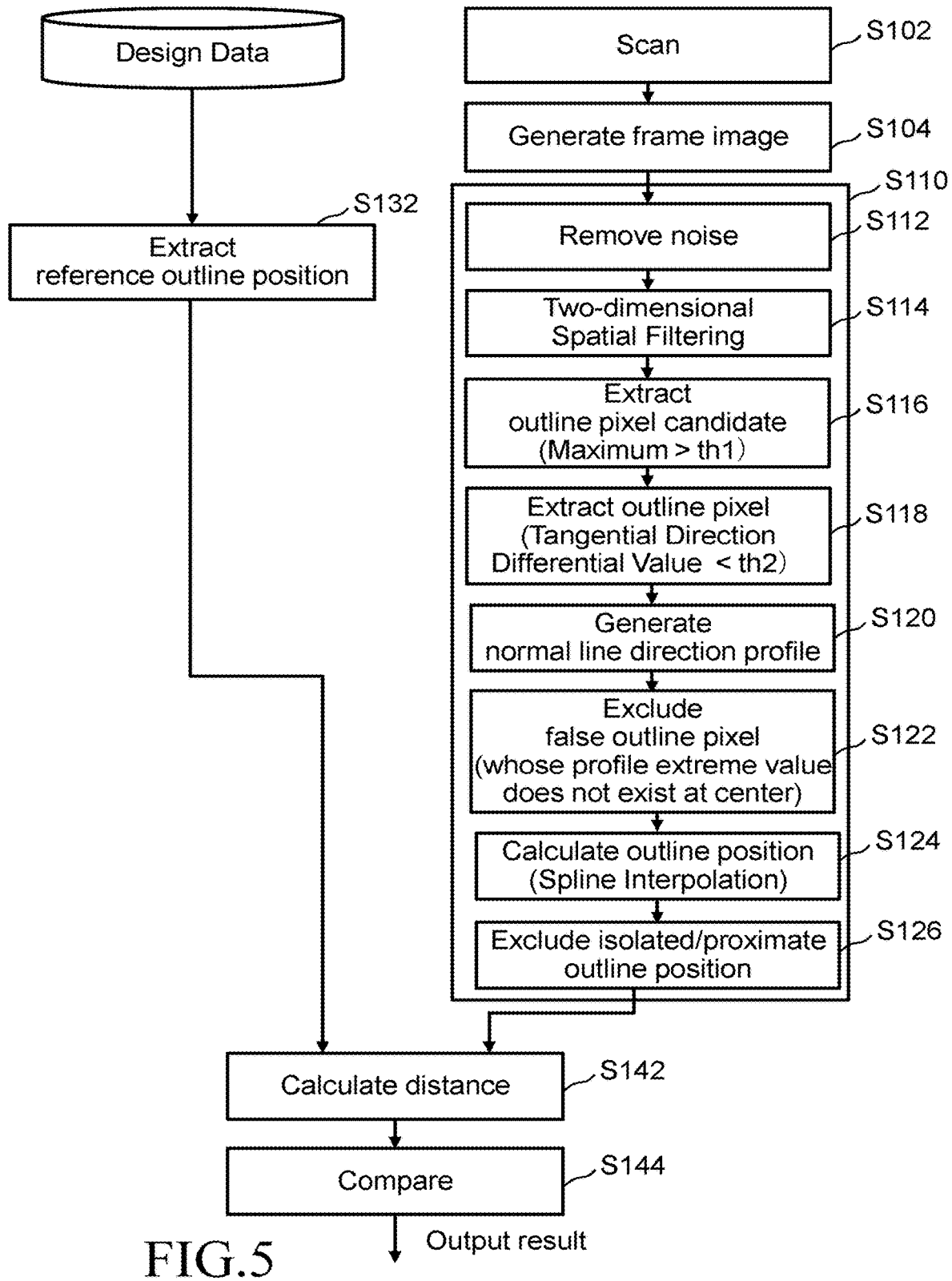
FIG. 5 is a flowchart showing an example of main steps of an inspection method according to the first embodiment.

FIG. 5 is a flowchart showing an example of main steps of an inspection method according to the first embodiment. In FIG. 5, the inspection method of the first embodiment executes a series of steps: a scanning step (S102), a frame image generation step (S104), a real image outline position extraction step (S110), a reference outline position extraction step (S132), a distance calculation step (S142), and a comparison step (S144). The real image outline position extraction step (S110) executes a series of steps as internal steps: a noise removal step (S112), a two-dimensional spatial filtering step (S114), an outline pixel candidate extraction step (S116), an outline pixel extraction step (S118), a normal direction profile generation step (S120), a false outline pixel exclusion step (S122), an outline position calculation step (S124), and an isolated/proximate outline position exclusion step (S126).

In the scanning step (S102), the image acquisition mechanism 150 acquires an image of the substrate 101 on which a figure pattern has been formed. Specifically, the image acquisition mechanism 150 irradiates the substrate 101, on which a plurality of figure patterns has been formed, with the multiple primary electron beams 20 to acquire a secondary electron image of the substrate 101 by detecting the multiple secondary electron beams 300 emitted from the substrate 101 due to the irradiation with the multiple primary electron beams 20. As described above, reflected electrons and secondary electrons may be projected on the multi-detector 222, or alternatively, after reflected electrons having been emitted along the way, only remaining secondary electrons (the multiple secondary electron beams 300) may be projected thereon.

As described above, the multiple secondary electron beams 300 emitted from the substrate 101 due to the irradiation with the multiple primary electron beams 20 are detected by the multi-detector 222. Detected data (measured image data: secondary electron image data: inspection image data) on a secondary electron of each pixel in each sub irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. In other words, a secondary electron image is generated by detecting multiple secondary electron beams emitted due to that the substrate 101 was irradiated with the multiple primary electron beams 20. Then, the acquired measured image data is transmitted to the comparison circuit 108, together with information on each position from the position circuit 107.

Figure 6:
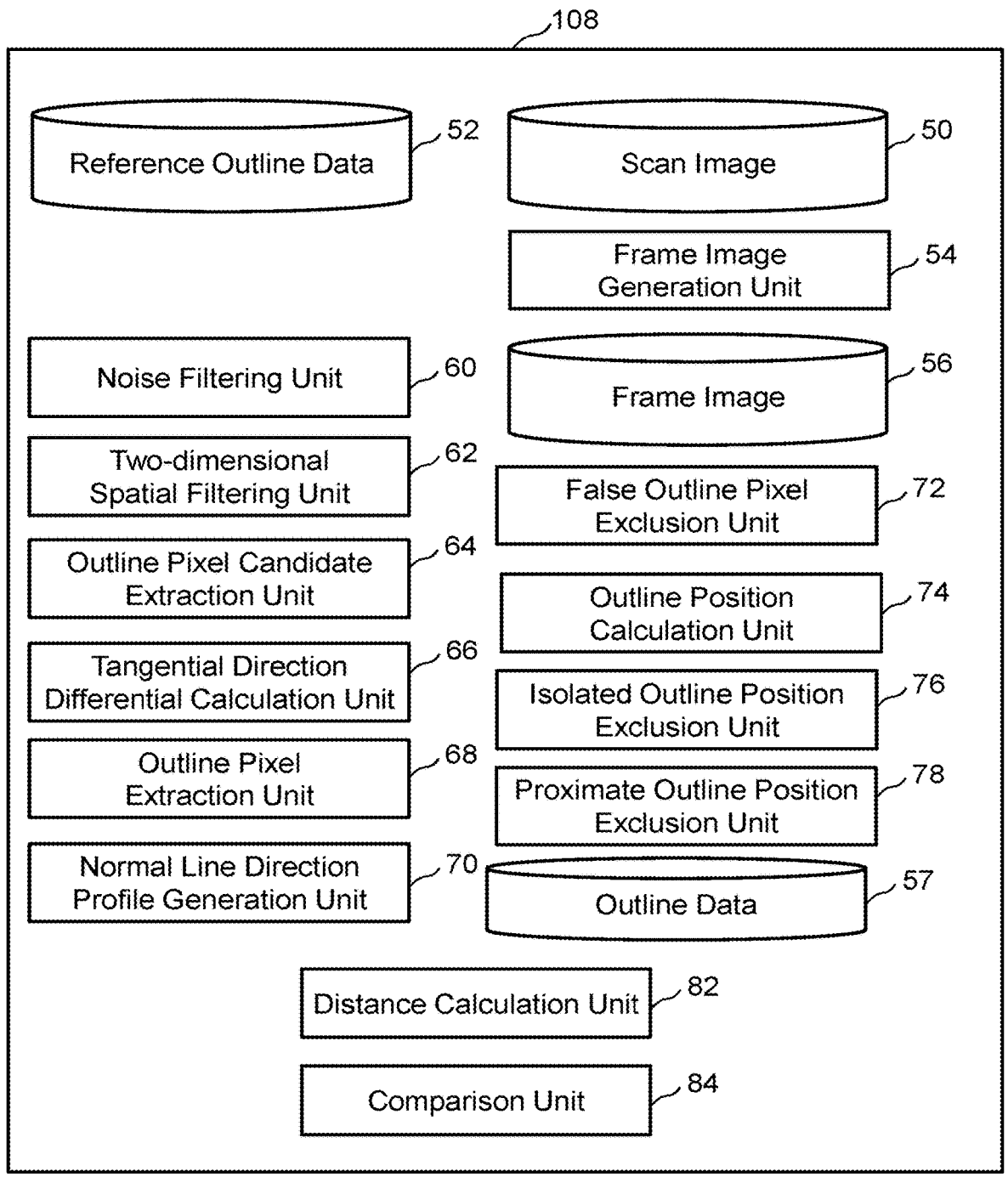
FIG. 6 is a block diagram showing an example of a configuration in a comparison circuit according to the first embodiment.

FIG. 6 is a block diagram showing an example of a configuration in a comparison circuit according to the first embodiment. In FIG. 6, in the comparison circuit 108, there are arranged storage devices 50, 52, 56, and 57 such as magnetic disk drives, a frame image generation unit 54, a noise filtering unit 60, a two-dimensional spatial filtering unit 62, an outline pixel candidate extraction unit 64, a tangential direction differential calculation unit 66, an outline pixel extraction unit 68, a normal direction profile generation unit 70, a false outline pixel exclusion unit 72, an outline position calculation unit 74, an isolated outline position exclusion unit 76, a proximate outline position exclusion unit 78, a distance calculation unit 82, and a comparison unit 84. Each of the "units" such as the frame image generation unit 54, the noise filtering unit 60, the two-dimensional spatial filtering unit 62, the outline pixel candidate extraction unit 64, the tangential direction differential calculation unit 66, the outline pixel extraction unit 68, the normal direction profile generation unit 70, the false outline pixel exclusion unit 72, the outline position calculation unit 74, the isolated outline position exclusion unit 76, the proximate outline position exclusion unit 78, the distance calculation unit 82, and the comparison unit 84 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry).

The data in the frame image generation unit 54, the noise filtering unit 60, the two-dimensional spatial filtering unit 62, the outline pixel candidate extraction unit 64, the tangential direction differential calculation unit 66, the outline pixel extraction unit 68, the normal direction profile generation unit 70, the false outline pixel exclusion unit 72, the outline position calculation unit 74, the isolated outline position exclusion unit 76, the proximate outline position exclusion unit 78, the distance calculation unit 82, and the comparison unit 84, and calculated results are stored in a memory (not shown) or in the memory 118 each time.

The image data (scan image) transmitted into the comparison circuit 108 is stored in the storage device 50.

In the frame image generation step (S104), the frame image generation unit 54 generates a frame image 31 of each of a plurality of frame regions 30 obtained by further dividing the image data of the sub-irradiation region 29 acquired by scanning with each primary electron beam 10. In order to prevent missing an image, it is preferable that margin regions overlap each other in each frame region 30. The generated frame image 31 is stored in the storage device 56.

In the real image outline position extraction step (S110), a plurality of outline positions of each figure pattern in the frame image 31 concerned is extracted for each frame image 31. Specifically, it operates as follows:

In the noise removal step (S112), the noise filtering unit 60 reads the frame image 31 from the storage device 56, and performs noise filtering for a figure pattern in the frame image 31 by removing a noise at the pattern end to smooth it. By the noise filtering, noise including a shot noise of an inspection image can be reduced. It is preferable to use, for example, a 5×5 Gaussian filter as a noise filter. Alternatively, for example, a 7×7 Gaussian filter may be used. The effect of a Gaussian filter can be increased as the number of matrix elements of the Gaussian filter increases. According to the first embodiment, noise can be substantially removed by using a Gaussian filter.

In the two-dimensional spatial filtering step (S114), using a plurality of two-dimensional spatial filter functions with different orientations (directions), the two-dimensional spatial filtering unit 62 (an example of filter processing unit) performs filter processing on the frame image 31, with respect to each direction. As each of the two-dimensional spatial filter functions, a linear sum of two two-dimensional Laplacian filter functions is used. It is especially preferable to use a linear sum of two or more two-dimensional Laplacian filter functions of different scales.

Figure 7:
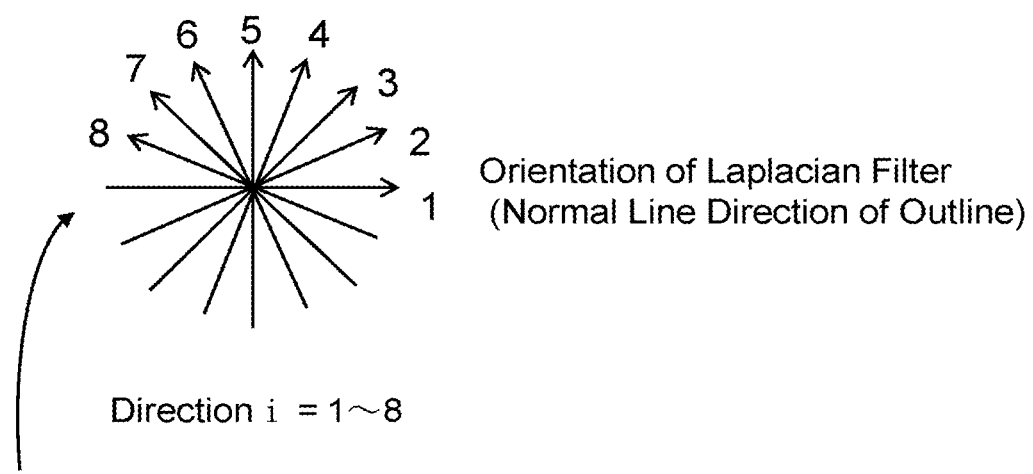
FIG. 7 shows an example of a two-dimensional Laplacian filter and orientations of the two-dimensional Laplacian filter according to the first embodiment.

FIG. 7 shows an example of a two-dimensional Laplacian filter and orientations of the two-dimensional Laplacian filter according to the first embodiment. In the case of FIG. 7, two two-dimensional Laplacian filter functions $f_{1i}$ and $f_{2i}$ of different scales are used. i indicates directions 1 to N of the orientations of the two-dimensional Laplacian filter. In FIG. 7, eight directions rotated from the x axis by 22.5 degrees each from 0 degree are set. That is, 0° (i=1), 22.5° (i=2), 45° (i=3), 67.5° (i=4), 90° (i=5), 112.5° (i=6), 135° (i=7), and 157.5° (i=8) are set.

In the example of FIG. 7, two-dimensional Laplacian filter $F_i$ in the direction of i is defined by the following linear-sum formula (1) using a coefficient k1. The coefficient k1 is an arbitrary value. For example, k1=0.5.

$$F_i = k1 \cdot f_{1i} + (1-k1) \cdot f_{2i} \quad (1)$$

Figure 8:
FIG. 8 shows examples of two-dimensional Laplacian filters in all (every) directions in a small scale according to the first embodiment.

FIG. 8 shows examples of two-dimensional Laplacian filters in all (every) directions in a small scale according to the first embodiment. FIG. 8 shows 3×3 two-dimensional Laplacian filters $f_{1i}$ in all (every) directions. That is, eight 3×3 two-dimensional Laplacian filters $f_{11}$ to $f_{18}$ with different directions are shown. Each of the two-dimensional Laplacian filters $f_{11}$ to $f_{18}$ performs a second differential in the direction of its own orientation.

Figure 9:
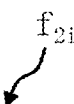
FIG. 9 shows examples of a part of two-dimensional Laplacian filters in all (every) directions in a large scale according to the first embodiment.

FIG. 9 shows examples of a part of two-dimensional Laplacian filters in all (every) directions in a large scale according to the first embodiment. FIG. 10 shows examples of a remaining part of two-dimensional Laplacian filters in all (every) directions in a large scale according to the first embodiment. FIGS. 9 and 10 show 5×5 two-dimensional Laplacian filters $f_{2i}$ in all (every) directions. That is, eight 5×5 two-dimensional Laplacian filters $f_{21}$ to $f_{28}$ with different directions are shown. FIG. 9 shows two-dimensional Laplacian filters $f_{21}$ to $f_{24}$, and FIG. 10 shows two-dimensional Laplacian filters $f_{25}$ to $f_{28}$. Each of the two-dimensional Laplacian filters $f_{21}$ to $f_{28}$ performs a second differential in the direction of its own orientation.

In the frame image 31, moving is performed with shifting per pixel two-dimensionally in a 5×5 pixel region. Then, by convolving, at each shift position, the two-dimensional Laplacian filter $F_1$ in i direction, a pixel value $L_i$ (second differential value in i direction: filter intensity) of the central pixel of 5×5 pixels after filter processing is calculated. The pixel value $L_i$ of the central pixel can be defined by the following formula (2). (I,J) shows the position of the 5×5 pixels concerned.

$$L_i = \Sigma D(I,J) \cdot F_i(I,J) \quad (2)$$

By this calculation, pixel values $L_1$ to $L_8$ after processing by eight filters in the directions 1 to 8 are acquired for each pixel in the frame image 31.

In the outline pixel candidate extraction step (S116), as a plurality of outline pixel candidates through which the outline of a figure pattern passes, the outline pixel candidate extraction unit 64 extracts a plurality of pixels each having a predetermined value, such as a maximum value Lmax, larger than a threshold th1 (first threshold), in pixel values Li for respective directions i of after filter processing. Then, for each outline pixel candidate, the direction corresponding to the maximum pixel value Lmax, which is an example of the predetermined value, in acquired pixel values Li after the filter processing is defined as the normal direction of the outline.

Figure 11:
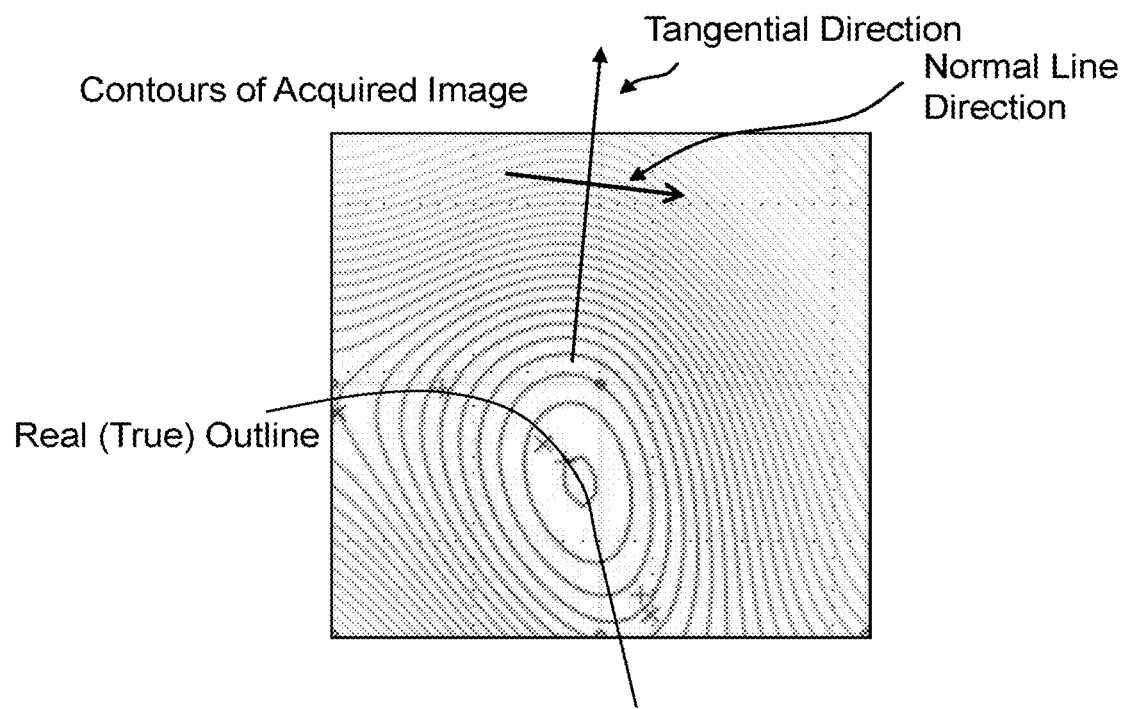
FIG. 11 shows that a pseudo outline pixel exists according to the first embodiment.

FIG. 11 shows, according to the first embodiment, that a pseudo outline pixel exists. In the frame image 31, there may exist a pixel with a high luminance due to charging-up and/or noise of an electron beam. As shown in FIG. 11, there is a case where contours are formed in a ridge-line shape at positions different from a real (true) outline. At such positions, the pixel value Li (intensity) of after two-dimensional spatial filter processing becomes large. It results in that a pseudo outline pixel is generated at a position not on the outline. With respect to the tangential direction of the outline, normally, there may be (should be) no or small inclination of the contours. Then, using this phenomenon, a pseudo outline pixel is excluded from a plurality of outline pixel candidates in the first embodiment.

In the outline pixel extraction step (S118), the tangential direction differential calculation unit 66 calculates, for each of a plurality of outline pixel candidates, a differential value (first differential value) by differentiating a luminance value (pixel value) of before filter processing in the tangential direction (second direction) orthogonal to the normal direction (first direction) corresponding to the maximum value Lmax which is an example of a predetermined value.

Figure 12:
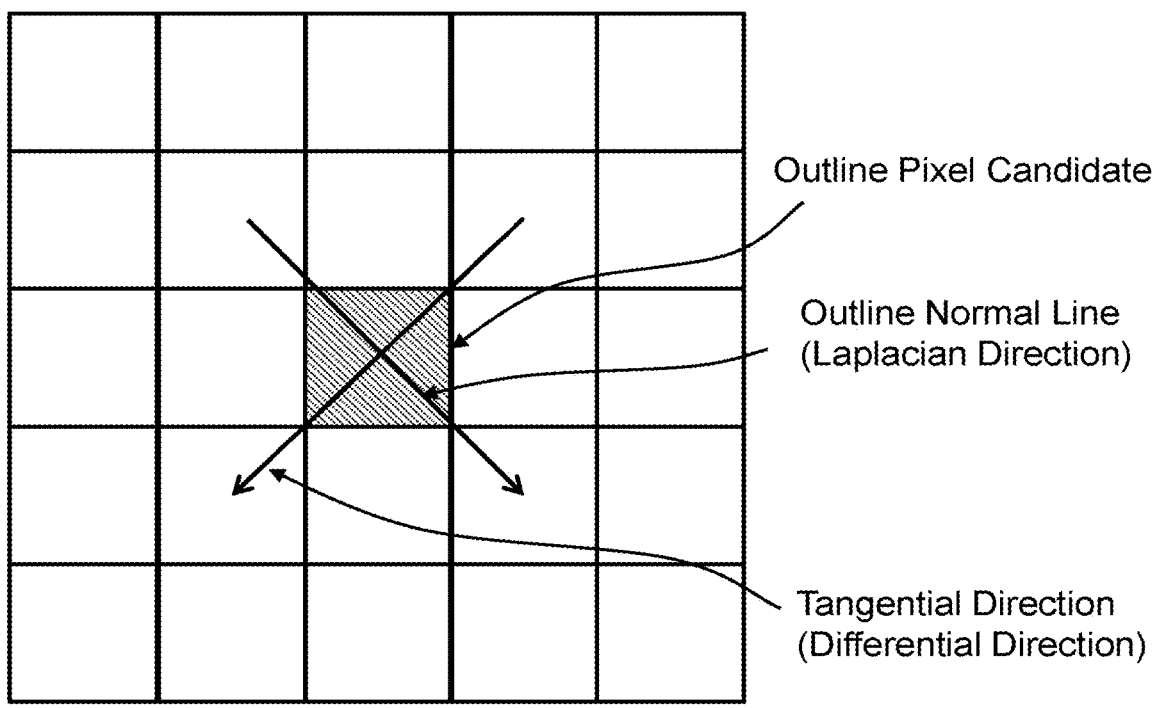
FIG. 12 illustrates a differential in a tangential direction according to the first embodiment.

FIG. 12 illustrates a differential in a tangential direction according to the first embodiment. The example of FIG. 12 shows a pixel group composed of 5×5 pixels centering on a target outline pixel candidate concerned. Here, assuming that the luminance value of each pixel is defined at the center of the pixel concerned, a differential is performed in a tangential direction. For example, assuming that the coordinates of an outline candidate pixel are (2,2) and the coordinates of the upper left pixel of the pixel group are (0, 0), it is preferable to subtract the pixel value of coordinates (3,1) from the pixel value of coordinates (1,3) and obtain its absolute value.

The outline pixel extraction unit 68 extracts a plurality of outline pixels from a plurality of outline pixel candidates by excluding outline pixel candidates each having a first differential value greater than or equal to a threshold th2 (the second threshold), where the first differential value is obtained by first differentiating a pixel value of before filter processing in the tangential direction orthogonal to the normal direction corresponding to a predetermined value such as the maximum value Lmax. It is preferable to use, as the threshold th2, a value obtained by multiplying a pixel value $L_i$ (filter intensity: intensity after spatial filtering) of after two-dimensional spatial filter processing on the pixel concerned by a coefficient k2. In other words, if the filter intensity is larger than a certain ratio (k2), it is not determined as an outline. The coefficient k2 can be set arbitrarily. For example, preferably, k2=0.5.

Thus, outline pixels through which the outline of a figure pattern passes can be extracted. Next, the outline position through which the outline passes in each outline pixel is acquired per sub-pixel.

In the normal direction profile generation step (S120), for each outline pixel, the normal direction profile generation unit 70 samples luminance values (gray-scale level values) at respective sampling positions at intervals of a pixel size L1, in the normal direction, originating from the center position of the outline pixel concerned. Then, the normal direction profile generation unit 70 generates, for each outline pixel, a one-dimensional profile in the normal direction centering on the center position of the outline pixel concerned, using luminance values at respective, for example, seven sampling positions.

Figure 13:
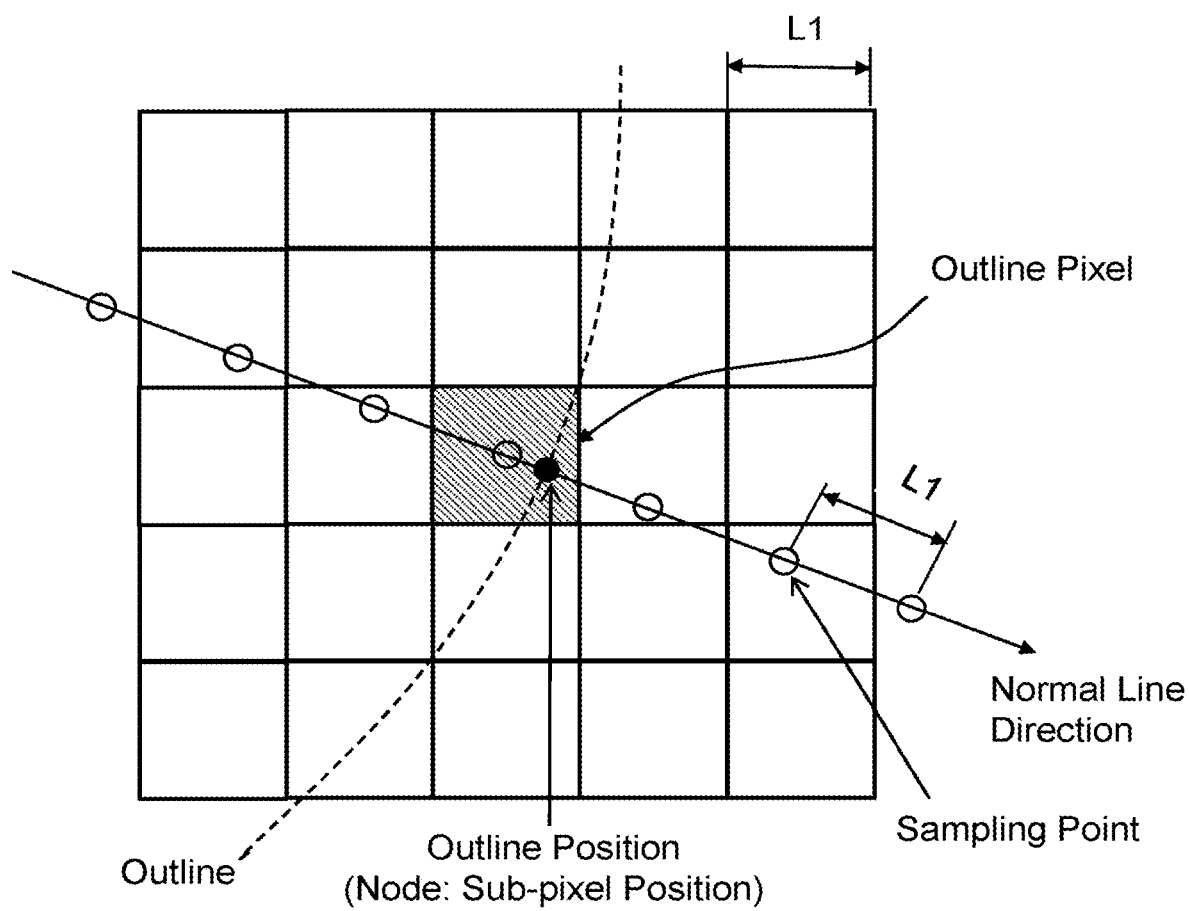
FIG. 13 shows an example of a sampling position in a normal direction according to the first embodiment.

FIG. 13 shows an example of a sampling position in a normal direction according to the first embodiment. FIG. 13 shows 5×5 pixels centering on a target outline pixel. As shown in FIG. 13, a plurality of sampling positions are set in the normal direction before and after the center position of the outline pixel concerned. FIG. 13 shows totally seven sampling positions, three each before and after the center position of the outline pixel concerned. As the luminance value at the center position of the outline pixel concerned, the pixel value (gray-scale level value) of the outline pixel concerned can be used as it is. With respect to the remaining six positions, interpolation is performed using luminance values of surrounding peripheral pixels. The normal direction profile generation unit 70 (interpolation processing unit) calculates, for example, by bicubic interpolation, a luminance value (gray-scale level value) at each sampling position forming a one-dimensional profile in the normal direction. In the bicubic interpolation, the luminance value (gray-scale level value) of a target sampling position (x,y) is obtained by interpolation by a cubic equation, using luminance values (pixel values: gray-scale level values) of 4×4 pixels (16 pixels) composed of the pixel in which the target sampling position (x,y) is located and of surrounding plural pixels. This is the stage where luminance values at the seven, for example, sampling positions in the normal direction have been obtained and the outline position shown in FIG. 13 is still undetermined.

In the false outline pixel exclusion step (S122), for each outline pixel, the false outline pixel exclusion unit 72 excludes, as a false outline pixel, an outline pixel whose extreme value of the one-dimensional profile in the obtained normal direction does not exist close to the center of the one-dimensional profile.

Figure 14:
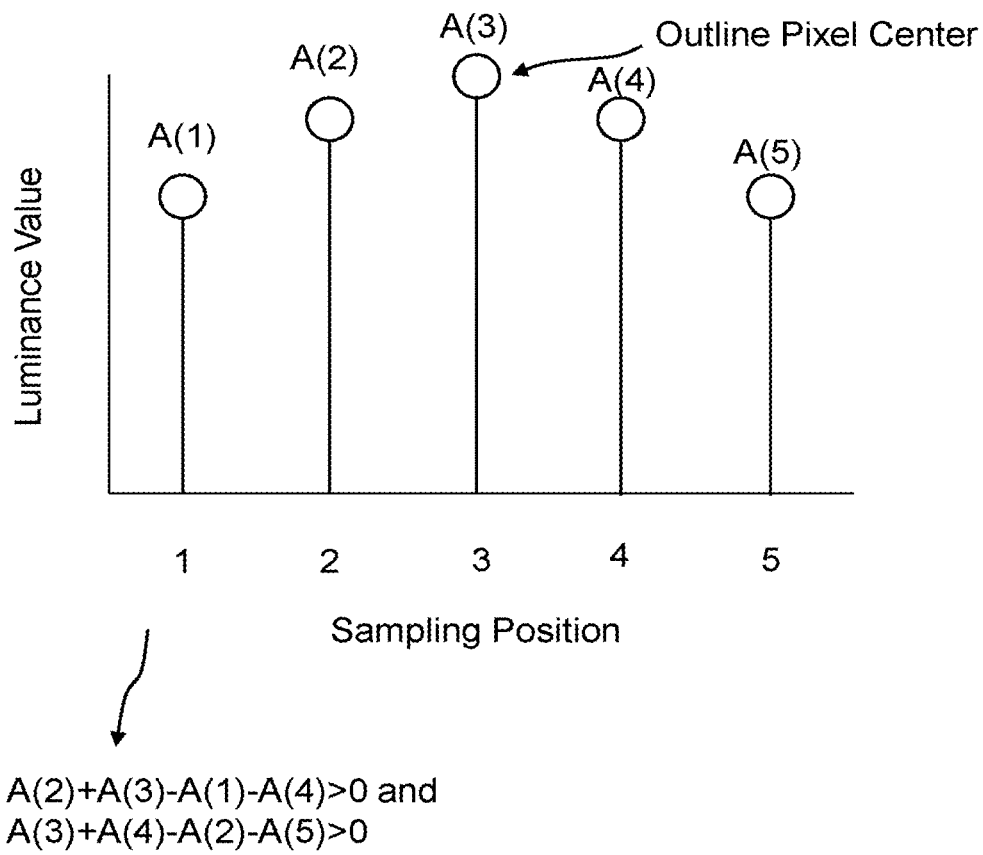
FIG. 14 illustrates a method for determining whether an extreme value of a one-dimensional profile exists close to the center of the one-dimensional profile or not according to the first embodiment.

FIG. 14 illustrates a method for determining whether an extreme value of a one-dimensional profile exists close to the center of the one-dimensional profile or not according to the first embodiment. FIG. 14 shows the case using luminance values A(1) to A(5) at the five sampling positions 1 to 5 aligned in one dimension. Defining the center position of the outline pixel concerned as the sampling position 3, sampling positions of two each before and after the center position are used. The false outline pixel exclusion unit 72 calculates, for each outline pixel, the following equations (3-1) and (3-2), and determines whether either the equation (3-1) or the equation (3-2) is satisfied.

$$A(2)+A(3)-A(1)-A(4)>0 \quad (3\text{-}1)$$

$$A(3)+A(4)-A(2)-A(5)>0 \quad (3\text{-}2)$$

If neither the equation (3-1) nor the equation (3-2) is satisfied, the false outline pixel exclusion unit 72 excludes the outline pixel concerned from a plurality of outline pixels, as a false outline pixel in which the extreme value of the one-dimensional profile does not exist close to the center. Moreover, in order to tighten the outline extraction conditions, when one of the equations (3-1) and (3-2) is not satisfied, the false outline pixel exclusion unit 72 may exclude the outline pixel concerned.

In the outline position calculation step (S124), the outline position calculation unit 74 calculates, for each of a plurality of outline pixels, an outline position per sub-pixel, using the one-dimensional profile in the normal direction corresponding to a predetermined value such as the maximum value Lmax. The outline position calculation unit 74 calculates the peak position of a one-dimensional profile, as an outline position, by performing one-dimensional spatial filter processing on the one-dimensional profile in the normal direction. Preferably, a one-dimensional Laplacian filter function is used for the one-dimensional spatial filter processing performed on the one-dimensional profile.

Figure 15:
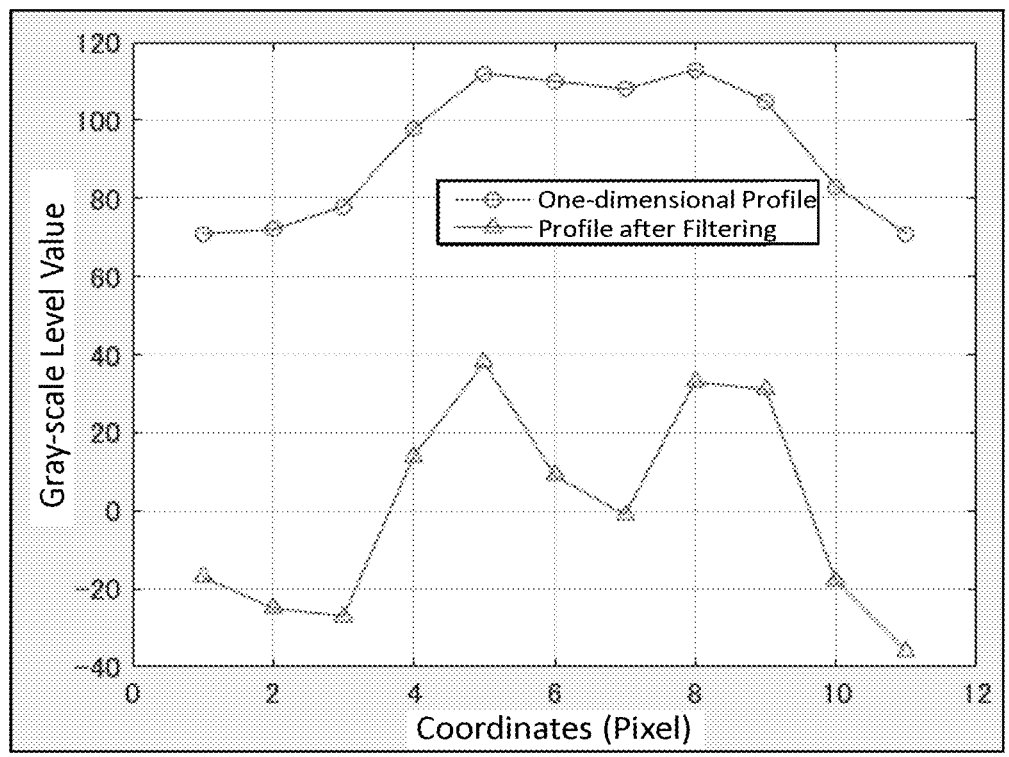
FIG. 15 shows an example of a one-dimensional profile and an example of a profile of after one-dimensional spatial filter processing according to the first embodiment.

FIG. 15 shows an example of a one-dimensional profile and an example of a profile of after one-dimensional spatial filter processing according to the first embodiment. The outline position calculation unit 74 convolutes/convolves a one-dimensional Laplacian filter with the one-dimensional profile obtained by sampling. As the one-dimensional Laplacian filter, it is preferable to use a filter of one row and five columns, −1, 0, 2, 0, −1, for example. The edge position is emphasized by the one-dimensional Laplacian filter processing.

Then, the outline position calculation unit 74 generates, for each outline pixel, a profile of a gentle curve of after filter processing by performing a spline interpolation to the one-dimensional Laplacian intensity at obtained plural sampling positions. As a method for generating a profile of a gentle curve, an interpolation method such as a Lagrange interpolation, B-spline interpolation, and secondary interpolation can be used in addition to the spline interpolation.

Figure 16:
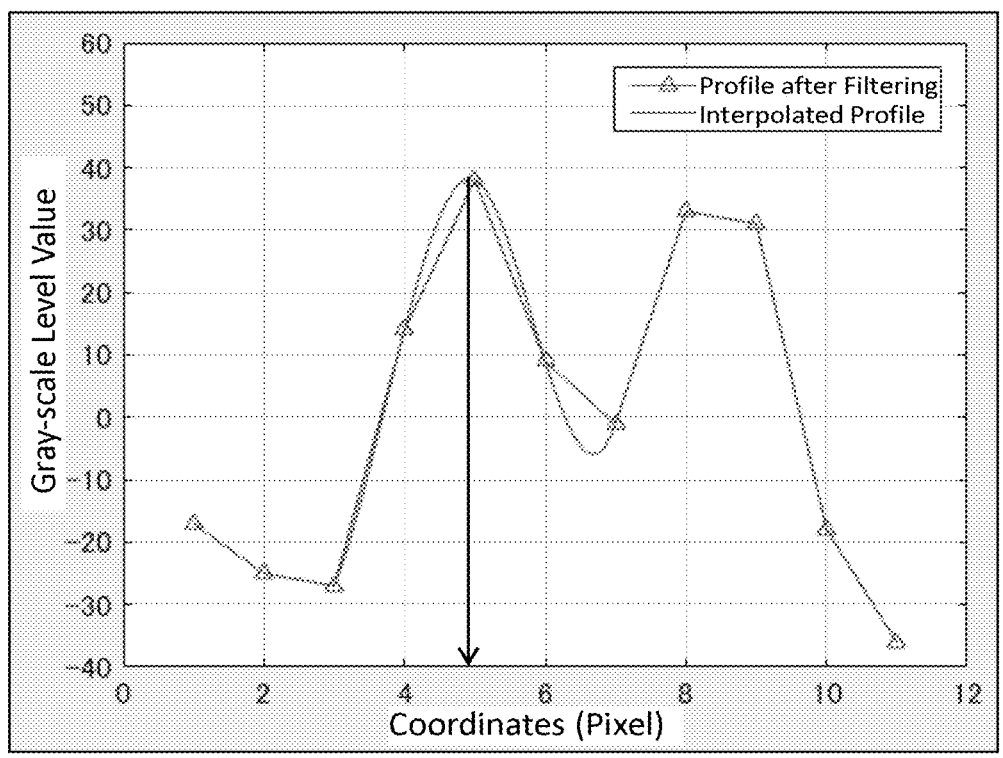
FIG. 16 shows an example of a profile of after filter processing by spline interpolation according to the first embodiment.

FIG. 16 shows an example of a profile of after filter processing by spline interpolation according to the first embodiment. The outline position calculation unit 74 calculates, per sub-pixel, a peak position of a gentle curve profile of after filter processing, as an outline position.

Thereby, the outline position shown in FIG. 13 can be obtained. The outline positions in units of sub-pixels are stored in a predetermined coordinate system, such as rectangular coordinate system or polar coordinate system, for each pixel where the outline exists. Moreover, the normal direction is also stored for each pixel. When a polar coordinate system is used, if the origin is used as the pixel center, and angle coordinates are in the normal direction, it is preferably possible to save the amount of information.

In the isolated/proximate outline position exclusion step (S126), the isolated outline position exclusion unit 76 excludes an isolated outline position(s) in a plurality of obtained outline positions.

Figure 17:
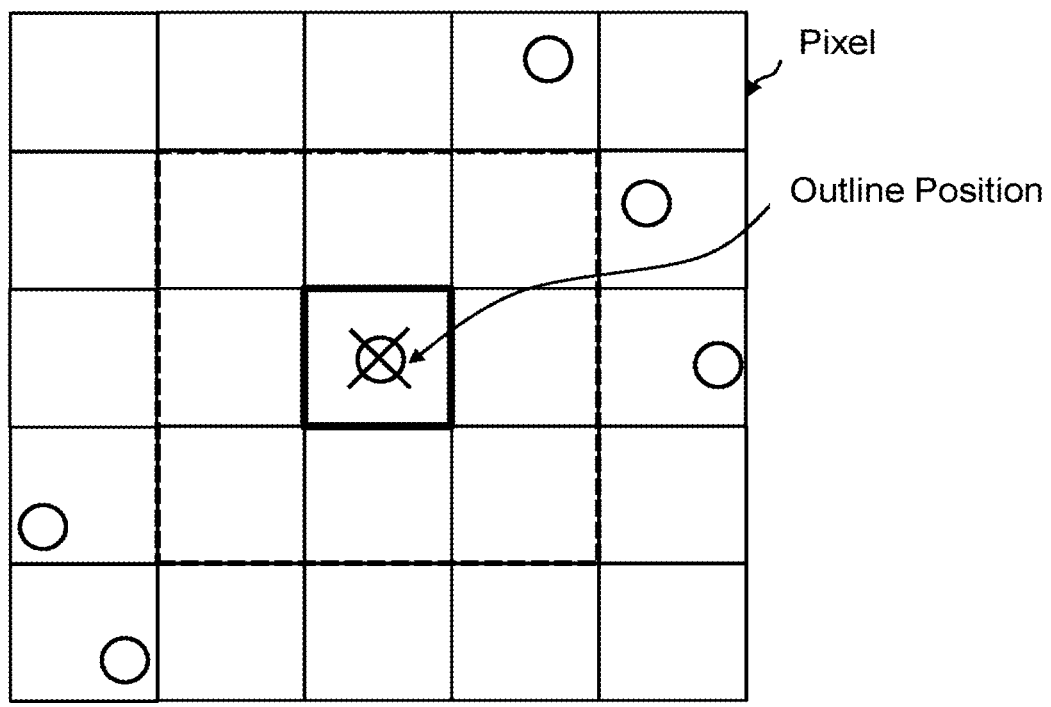
FIG. 17 shows an example of an isolated outline position according to the first embodiment.

FIG. 17 shows an example of an isolated outline position according to the first embodiment. FIG. 17 shows a region of 5×5 pixels centering on the pixel in which a target outline position is located. In order to suppress erroneous detection of defects, when the number of outline positions existing in, for example, a 3×3 pixel region composed of the pixel including the target outline position and its surrounding pixels is smaller than or equal to a threshold (third threshold), it is excluded as an isolated outline position. As this threshold, it is preferable to set 1 or 2, for example.

The proximate outline position exclusion unit 78 excludes one of outline positions close to each other, in a plurality of acquired outline positions.

Figure 18:
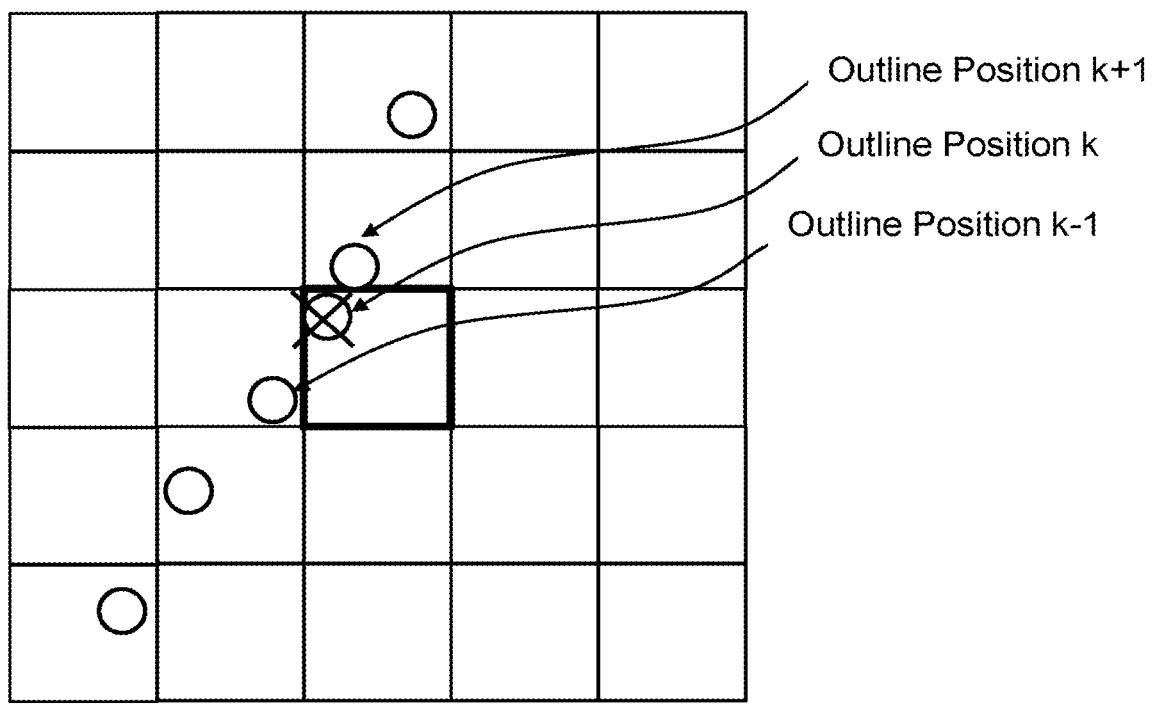
FIG. 18 shows an example of a proximate outline position according to the first embodiment.

FIG. 18 shows an example of a proximate outline position according to the first embodiment. FIG. 18 shows a region of 5×5 pixels centering on the pixel in which a target outline position is located. In order to reduce loads on comparison processing and reduce errors in processing for estimating an outline, if there are outline positions whose mutual distance is lower than or equal to a threshold (the fourth threshold), either one of them is excluded. In the example of FIG. 18, since the distance between the outline position k and the outline position k+1 is small, the outline position k, for example, is excluded.

Thereby, outline positions of a figure pattern in the frame image 31 can be accurately extracted. Information on each acquired outline position is stored, as outline data, in the storage device 57.

In the reference outline position extraction step (S132), based on design data serving as a basis of a figure pattern formed on the substrate 101, the reference outline position extraction circuit 112 extracts, for each frame region 30, a plurality of outline positions on the outline (reference outline) of the figure pattern in the frame region 30 concerned.

Figure 19:
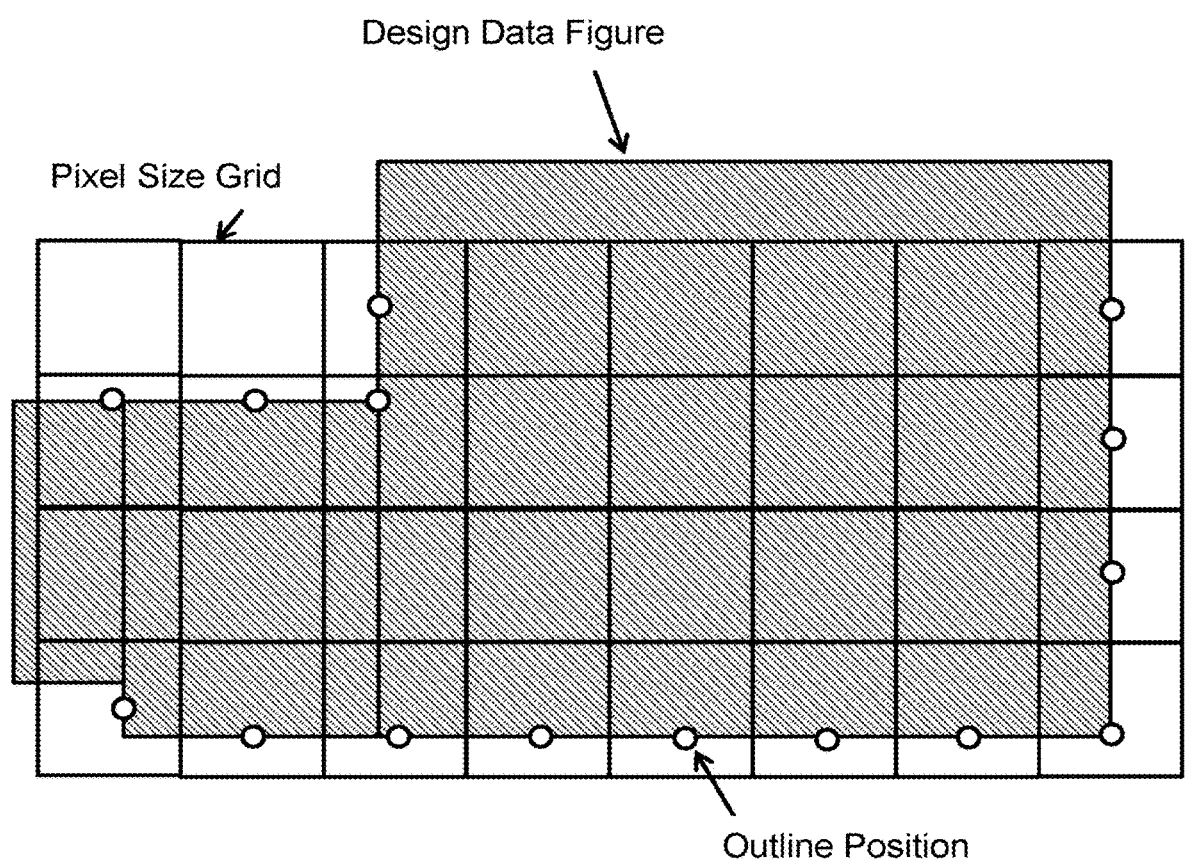
FIG. 19 illustrates a method for extracting a reference outline position according to the first embodiment.

FIG. 19 illustrates a method for extracting a reference outline position according to the first embodiment. In FIG. 19, a pixel size grid is set for design data. The midpoint of a straight line in a square equivalent to a pixel is defined as a reference outline position. If a corner of a figure pattern exists, the corner vertex is defined as a reference outline position. If a plurality of corners exist, the middle point of the corner vertexes is defined as a reference outline position. Thereby, outline positions of a figure pattern as a design pattern in the frame region 30 can be extracted with sufficient accuracy. Information on each acquired reference outline position (reference outline data) is output to the comparison circuit 108. In the comparison circuit 108, the reference outline data is stored in the storage device 52.

The method for extracting a reference outline position is not limited thereto. It is also preferable that a reference image is generated from design data, and then using the reference image, a reference outline position is extracted from the reference image by the same method as that of extracting outline positions from the frame image 31 being a measured image. Alternatively, a plurality of outline positions may be extracted by other conventional methods.

In the case of extracting a reference outline position from a reference image, first, a reference image is generated. In that case, a reference image generation circuit (not shown) generates, for each frame region 30, a reference image corresponding to the frame image 31 concerned, based on design data serving as a basis of a figure pattern formed on the substrate 101. Specifically, it operates as follows: First, design pattern data is read from the storage device 109 through the control computer 110, and each figure pattern defined by the read design pattern data is converted into image data of binary or multiple values.

Basic figures defined by the design pattern data are, for example, rectangles and triangles. For example, there is stored figure data defining the shape, size, position, and the like of each pattern figure by using information, such as coordinates (x,y) of the reference position of the figure, lengths of sides of the figure, and a figure code serving as an identifier for identifying the figure type such as rectangles, triangles and the like.

When design pattern data used as the figure data is input to the reference image generation circuit, the data is developed into data of each figure. Then, the figure code, figure dimensions, and the like indicating the figure shape of each figure data are interpreted. Then, the reference image generation circuit develops each figure data to design pattern image data of binary or multiple values as a pattern to be arranged in squares in units of grids of predetermined quantization dimensions, and outputs the developed data. In other words, the reference image generation circuit reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8 (=1/256)$, the occupancy in each pixel is calculated by allocating small regions which correspond to the region of figures arranged in the pixel concerned and each of which corresponds to $1/256$ resolution. Then, 8-bit occupancy data is generated. Such square regions (inspection pixels) can be corresponding to (matched with) pixels of measured data.

Next, the reference image generation circuit performs filter processing, using a predetermined filter function, on design image data of a design pattern which is image data of a figure. Thereby, it is possible to match design image data being image data on the design side, whose image intensity (gray scale level) is in digital values, with image generation characteristics obtained by irradiation of the multiple primary electron beam 20. The image data for each pixel of the generated reference image is output to the comparison circuit 108. The reference image data transmitted to the comparison circuit 108 is stored in the storage device 109, for example. A reference outline position can be extracted by the same method as that of extracting an outline position from the frame image 31.

In the distance calculation step (S142), the distance calculation unit 82 calculates a distance from each of a plurality of outline positions in the frame image 31 (real image) to a reference outline passing through a reference outline position.

Figure 20:
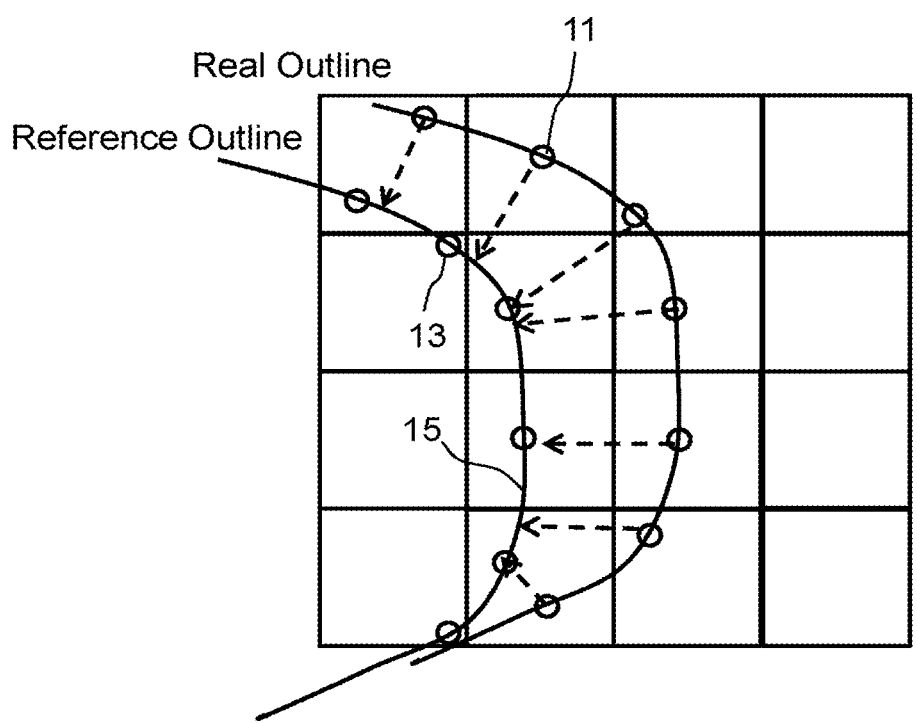
FIG. 20 shows an example of a distance between outlines according to the first embodiment.

FIG. 20 shows an example of a distance between outlines according to the first embodiment. FIG. 20 shows the case of calculating the shortest distance from each outline position 11 in the frame image 31 (real image) to the reference outline 15. The definition of the distance is not limited thereto. It is also preferable to calculate a distance from each outline position 11 in the frame image 31 (real image) to the closest reference outline position in a plurality of reference outline positions 13 in a reference image. Alternatively, an x-direction distance (or y-direction distance) from each outline position 11 to the reference outline 15 may be calculated. Alternatively, it is also preferable to calculate the distance by other calculation methods.

In the comparison step (S144), the comparison unit (comparison circuit) compares an outline of the frame image 31 with a reference outline, based on data of the outline position. Specifically, if an outline position exists whose distance calculated using data of the outline position as described above is larger than a determination threshold, the outline position is determined to be a defect. The comparison result is output to the storage device 109, the monitor 117, or the memory 118.

In the examples described above, as a die-to-database inspection, a reference image generated based on design data or a reference outline position (or reference outline) obtained from design data is compared with a frame image being a measured image. However, it is not limited thereto. For example, as a die-to-die inspection, it is preferable that, in a plurality of dies on each of which the same pattern is formed, a frame image of one die is compared with a frame image of another die. In the case of the die-to-die inspection, as reference outline positions, a plurality of outline positions in the frame image 31 of the die 2 may be extracted by the same method as that of extracting a plurality of outline positions in the frame image 31 of the die 1. Then, the distance between the outline of the die 1 and the outline of the die 2 may be calculated.

As described above, according to the first embodiment, outline positions can be highly accurately extracted. Therefore, accuracy of defect detection can be improved.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a computer to execute processing or the like may be stored in a recording medium, such as a magnetic disk drive, flash memory, etc. For example, the position circuit 107, the comparison circuit 108, the reference outline position extraction circuit 112, the stage control circuit 114, the lens control circuit 124, the blanking control circuit 126, and the deflection control circuit 128 may be configured by at least one processing circuit described above.

Embodiments have been explained referring to specific examples described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by irradiation with a primary electron beam from each of a plurality of irradiation sources.

While the apparatus configuration, control method, and the like have not directly necessary for explaining the present invention are not described, some or all of them can be appropriately selected and used on a case-by-case basis when needed.

In addition, any other outline position acquisition method, pattern inspection method, and pattern inspection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus comprising:
   an image acquisition mechanism configured to include an emission source to emit beams, a lens to focus the beams, and a detector to detect a beam intensity, and configured to acquire an image of a substrate on which a figure pattern has been formed;
   a filter processing circuit configured to perform, for each direction, filter processing on the image, using a plurality of two-dimensional spatial filter functions with different orientations;
   an outline pixel candidate extraction circuit configured to extract a plurality of pixels each having a predetermined value larger than a first threshold, in pixel values each for the each direction of after the filter processing, as a plurality of outline pixel candidates through which an outline of the figure pattern passes;
   an outline pixel extraction circuit configured to extract a plurality of outline pixels from the plurality of outline pixel candidates by excluding outline pixel candidates each of which has a differential value, greater than or equal to a second threshold, obtained by differentiating a pixel value of before the filter processing in a second direction orthogonal to a first direction corresponding to the predetermined value;
   an outline position calculation circuit configured to calculate, for each of the plurality of outline pixels, an outline position per sub-pixel, using a one-dimensional profile in the first direction corresponding to the predetermined value; and
   a comparison circuit configured to compare an outline of the image and a predetermined reference outline, based on data of the outline position.

2. The apparatus according to claim 1, wherein, as each of the plurality of two-dimensional spatial filter functions, a linear sum of at least two two-dimensional spatial filter functions is used.

3. The apparatus according to claim 1 further comprising:
   an interpolation processing circuit configured to calculate, by bicubic interpolation, a luminance value at each position forming the one-dimensional profile in the first direction.

4. The apparatus according to claim 1, wherein the outline position calculation circuit calculates, as the outline position, a peak position of the one-dimensional profile by performing one-dimensional spatial filter processing on the one-dimensional profile in the first direction.

5. The apparatus according to claim 1, wherein the outline position calculation circuit uses a one-dimensional Laplacian filter function to perform one-dimensional spatial filter processing on the one-dimensional profile.

6. The apparatus according to claim 1, wherein a maximum value is used as the predetermined value.

7. The apparatus according to claim 1, wherein the image acquisition mechanism includes a shaping aperture array substrate to form multiple primary electron beams, and as the image, used a secondary electron image generated by detecting multiple secondary electron beams emitted due to that the substrate is irradiated with the multiple primary electron beams.

8. A pattern outline position acquisition method comprising:

performing, for each direction, filter processing on an image of a substrate on which a figure pattern has been formed, using a plurality of two-dimensional spatial filter functions with different orientations;

extracting a plurality of pixels each having a predetermined value larger than a first threshold, in pixel values each for the each direction of after the filter processing, as a plurality of outline pixel candidates through which an outline of the figure pattern passes;

extracting a plurality of outline pixels from the plurality of outline pixel candidates by excluding outline pixel candidates each of which has a differential value, greater than or equal to a second threshold, obtained by differentiating a pixel value of before the filter processing in a second direction orthogonal to a first direction corresponding to the predetermined value; and calculating, for each of the plurality of outline pixels, an outline position per sub-pixel, using a one-dimensional profile in the first direction corresponding to the predetermined value, and outputting the outline position.

9. The method according to claim 8, wherein, as each of the plurality of two-dimensional spatial filter functions, a linear sum of at least two two-dimensional spatial filter functions is used.

10. The method according to claim 8 further comprising:

calculating, by bicubic interpolation, a luminance value at each position forming the one-dimensional profile in the first direction.

11. The method according to claim 8, wherein the calculating uses, as the outline position, a peak position of the one-dimensional profile by performing one-dimensional spatial filter processing on the one-dimensional profile in the first direction.

12. The method according to claim 8, wherein performing one-dimensional spatial filter processing on the one-dimensional profile uses a one-dimensional Laplacian filter function.

13. The method according to claim 8, wherein a maximum value is used as the predetermined value.

14. The method according to claim 8, wherein, as the image, used a secondary electron image generated by detecting multiple secondary electron beams emitted due to that the substrate is irradiated with multiple primary electron beams.

* * * * *